United States Patent
Abadeer et al.

(10) Patent No.: US 7,790,524 B2
(45) Date of Patent: Sep. 7, 2010

(54) DEVICE AND DESIGN STRUCTURES FOR MEMORY CELLS IN A NON-VOLATILE RANDOM ACCESS MEMORY AND METHODS OF FABRICATING SUCH DEVICE STRUCTURES

(75) Inventors: Wagdi W. Abadeer, Jericho, VT (US); Kiran V. Chatty, Williston, VT (US); Robert J. Gauthier, Jr., Hinesburg, VT (US); Jed H. Rankin, Richmond, VT (US); Yun Shi, South Burlington, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 40 days.

(21) Appl. No.: 11/972,949

(22) Filed: Jan. 11, 2008

(65) Prior Publication Data
US 2009/0179251 A1    Jul. 16, 2009

(51) Int. Cl.
    *H01L 21/00* (2006.01)
(52) U.S. Cl. ................ 438/151; 438/266; 257/E21.209
(58) Field of Classification Search ................ 438/266, 438/151; 257/E21.209
    See application file for complete search history.

(56) References Cited

U.S. PATENT DOCUMENTS

| | | | |
|---|---|---|---|
| 4,619,033 A | 10/1986 | Jastrzebski | |
| 5,416,041 A | 5/1995 | Schwalke | |
| 5,494,837 A | 2/1996 | Subramanian et al. | |
| 5,496,765 A | 3/1996 | Schwalke | |
| 5,637,898 A | 6/1997 | Baliga | |
| 5,689,127 A | 11/1997 | Chu et al. | |
| 5,700,712 A | 12/1997 | Schwalke | |
| 5,726,094 A | 3/1998 | Schwalke et al. | |
| 6,121,651 A | 9/2000 | Furukawa et al. | |
| 6,140,684 A | 10/2000 | Chan et al. | |

(Continued)

OTHER PUBLICATIONS

Ahn, et al., Comparison of Performance and Reliability Between MOSFET's with LPCVD Gate Oxide and Thermal Gate Oxide, IEEE Transactions on Electron Devices, vol. 38, No. 12, Dec. 1991 (2 pages).

(Continued)

*Primary Examiner*—Thao X Le
*Assistant Examiner*—Elias Ullah
(74) *Attorney, Agent, or Firm*—Wood, Herron & Evans, LLP

(57) ABSTRACT

Device and design structures for memory cells in a non-volatile random access memory (NVRAM) and methods for fabricating such device structures using complementary metal-oxide-semiconductor (CMOS) processes. The device structure, which is formed using a semiconductor-on-insulator (SOI) substrate, includes a floating gate electrode, a semiconductor body, and a control gate electrode separated from the semiconductor body by the floating gate electrode. The floating gate electrode, the control gate electrode, and the semiconductor body, which are both formed from the monocrystalline SOI layer of the SOI substrate, are respectively separated by dielectric layers. The dielectric layers may each be composed of thermal oxide layers grown on confronting sidewalls of the semiconductor body, the floating gate electrode, and the control gate electrode. An optional deposited dielectric material may fill any remaining gap between either pair of the thermal oxide layers.

16 Claims, 5 Drawing Sheets

U.S. PATENT DOCUMENTS

| | | |
|---|---|---|
| 6,191,447 B1 | 2/2001 | Baliga |
| 6,228,745 B1 | 5/2001 | Wheeler et al. |
| 6,313,482 B1 | 11/2001 | Baliga |
| 6,323,082 B1 | 11/2001 | Furukawa et al. |
| 6,365,462 B2 | 4/2002 | Baliga |
| 6,483,156 B1 | 11/2002 | Adkisson et al. |
| 6,580,137 B2 | 6/2003 | Parke |
| 6,583,469 B1 | 6/2003 | Fried et al. |
| 6,624,459 B1 | 9/2003 | Dachtera et al. |
| 6,635,544 B2 | 10/2003 | Disney |
| 6,657,252 B2 | 12/2003 | Fried et al. |
| 6,750,105 B2 | 6/2004 | Disney |
| 6,764,889 B2 | 7/2004 | Baliga |
| 6,815,282 B2 | 11/2004 | Dachtera et al. |
| 6,949,768 B1 | 9/2005 | Anderson et al. |
| 6,960,507 B2 | 11/2005 | Kim et al. |
| 7,019,342 B2 | 3/2006 | Hackler, Sr. et al. |
| 7,052,958 B1 * | 5/2006 | Fried et al. .................. 438/257 |
| 7,078,296 B2 | 7/2006 | Chau et al. |
| 7,122,449 B2 | 10/2006 | Langdo et al. |
| 7,132,751 B2 | 11/2006 | Chang |
| 7,148,526 B1 | 12/2006 | An et al. |
| 7,217,603 B2 | 5/2007 | Currie et al. |
| 7,235,439 B2 | 6/2007 | Udrea et al. |
| 7,256,142 B2 | 8/2007 | Fitzgerald |
| 7,262,462 B2 | 8/2007 | Kim et al. |
| 7,462,905 B2 * | 12/2008 | Imai et al. ................... 257/316 |
| 2003/0178670 A1 | 9/2003 | Fried et al. |
| 2003/0218198 A1 | 11/2003 | Dachtera et al. |
| 2005/0017289 A1 | 1/2005 | Kim et al. |
| 2005/0242368 A1 | 11/2005 | Udrea et al. |
| 2005/0242369 A1 | 11/2005 | Udrea et al. |
| 2006/0027869 A1 | 2/2006 | Kim et al. |
| 2006/0084212 A1 | 4/2006 | Anderson et al. |
| 2007/0109836 A1 * | 5/2007 | Lung ........................... 365/148 |
| 2008/0286978 A1 * | 11/2008 | Chen et al. ................... 438/713 |
| 2009/0179268 A1 | 7/2009 | Abou-Khalil et al. |
| 2009/0179269 A1 | 7/2009 | Hook et al. |

OTHER PUBLICATIONS

Ahn, et al., "Electrical Properties of MOSFET's with N2O-Nitrided LPCVD SiO2 Gate Dielectrics", IEEE Electron Device Letters, vol. 13, No. 9, Sep. 1992 (3 pages).

Lee, et al., "Statistical Modeling of Silicon Dioxide Reliability", IEEE Reliability Physics Symposium, 26th Annual Proceedings, 1998, pp. 131-138.

Lee, et al., "Modeling and Characteriziation of Gate Oxide Reliability", IEEE Transactions on Electron Devices, vol. 35, No. 12, Dec. 1998, pp. 2268-2278.

USPTO, Office Action issued in related U.S. Appl. No. 11/972,941 dated Jan. 8, 2010.

USPTO, Office Action issued in related U.S. Appl. No. 12/013,101 dated Feb. 2, 2010.

USPTO, Notice of Allowance issued in related U.S. Appl. No. 12/013,101 dated Mar. 31, 2010.

USPTO, Notice of Allowance issued in related U.S. Appl. No. 11/972,941 dated Apr. 19, 2010.

Allan R. Wilson, Notice of Allowance issued in related U.S. Appl. No. 12/059,034 dated Apr. 19, 2010.

* cited by examiner

DEVICE AND DESIGN STRUCTURES FOR MEMORY CELLS IN A NON-VOLATILE RANDOM ACCESS MEMORY AND METHODS OF FABRICATING SUCH DEVICE STRUCTURES

CROSS-REFERENCE TO RELATED APPLICATIONS

This application is related to application Ser. No. 11/972,941, filed on even date herewith and entitled "Device Structures for a Metal-Oxide-Semiconductor Field Effect Transistor and Methods of Fabricating Such Device Structures".

FIELD OF THE INVENTION

The invention relates generally to semiconductor device fabrication and, in particular, to device structures and design structures for memory cells in a non-volatile random access memory (NVRAM) and methods for fabricating such device structures for memory cells using complementary metal-oxide-semiconductor (CMOS) processes.

BACKGROUND OF THE INVENTION

Complementary metal-oxide-semiconductor (CMOS) technology is used in microprocessors, static random access memories, and other diverse types of digital logic integrated circuits and analog integrated circuits. Conventional device structures for a planar field effect transistor (FET) fabricated using CMOS technology include a semiconductor layer, a source and a drain defined in the semiconductor layer, a channel defined in the semiconductor layer between the source and drain, and a control gate electrode. The material constituting the gate electrode in such conventional planar device structures contains polycrystalline silicon (polysilicon) or a metal applied by an additive process that involves blanket deposition of the material and patterning with a conventional lithography and etching process. When a control voltage exceeding a characteristic threshold voltage is applied to the control gate electrode, an inversion or depletion layer is formed in the channel by the resultant electric field and carrier flow occurs in the depletion layer between the source and drain (i.e., the device output current).

Non-volatile random access memory (NVRAM) refers generally any type of random access memory that retains the stored binary data even when not powered. A conventional device structure used as a memory cell in a NVRAM modifies the FET to add an electrically isolated (floating) gate electrode that affects conduction between the source and drain. In the vertical stack, a tunnel dielectric layer is interposed between the floating gate electrode and the channel. The control gate electrode, which has an overlying relationship in the vertical stack with the floating gate electrode, is separated from the floating gate electrode by an intergate dielectric layer. In such memory cells, binary data is represented by charge stored on the floating gate electrode. To provide one binary state, the floating gate electrode is charged during a write operation in which charge carriers tunnel or are injected from the biased control gate electrode through the tunnel dielectric layer to the floating gate electrode. Once the floating gate electrode has been charged, because the floating gate electrode is electrically isolated in the circuit, that charge remains intact without the requirement of being refreshed. To provide the other binary state, the charge stored by the floating gate electrode can be removed by reversing the bias on the control gate electrode, which drains charge carriers from the floating gate electrode. The memory cell is read by sensing the current flowing in the channel when the source and drain are properly biased, which is influenced by the charge stored by the floating gate electrode.

Improved device structures and fabrication methods are needed for a NVRAM that permit the use of high operating voltages for the constituent memory cells and that simplify their fabrication using CMOS technology.

SUMMARY OF THE INVENTION

In one embodiment, a device structure is provided for a non-volatile random access memory formed on an insulating layer. The device structure includes a semiconductor body, a control gate electrode, and a floating gate electrode in contact with the insulating layer. The semiconductor body includes a source, a drain, and a channel disposed between the source and the drain. The floating gate electrode is disposed between the control gate electrode and the channel of the semiconductor body. A first dielectric layer is disposed between the channel of the semiconductor body and the floating gate electrode. A second dielectric layer is disposed between the floating gate electrode and the control gate electrode. The first dielectric layer is composed of a first dielectric material that electrically isolates the floating gate electrode from the channel. The second dielectric layer is composed of a second dielectric material that electrically isolates the floating gate electrode from the control gate electrode.

In another embodiment, the device structure may be included in a design structure embodied in a machine readable medium for designing, manufacturing, or testing an integrated circuit. The design structure may comprise a netlist and may reside on storage medium as a data format used for the exchange of layout data of integrated circuits.

In another embodiment, a method is provided for fabricating a device structure for a non-volatile random access memory from a semiconductor layer carried on an insulating layer. The method includes forming first, second, and third semiconductor bodies from the semiconductor layer and with a juxtaposed relationship in which the second semiconductor body is disposed between the first and third semiconductor bodies. The first semiconductor body is doped to form a source and a drain. A first dielectric layer is formed between the first semiconductor body and the second semiconductor body and a second dielectric layer is formed between the second semiconductor body and the third semiconductor body. The method further includes partially removing the second semiconductor body and the third semiconductor body to respectively define a floating gate electrode and a control gate electrode that cooperate to control carrier flow in a channel between the source and the drain. The floating gate electrode may be self-aligned with the control gate electrode.

DETAILED DESCRIPTION

Figure 1A:
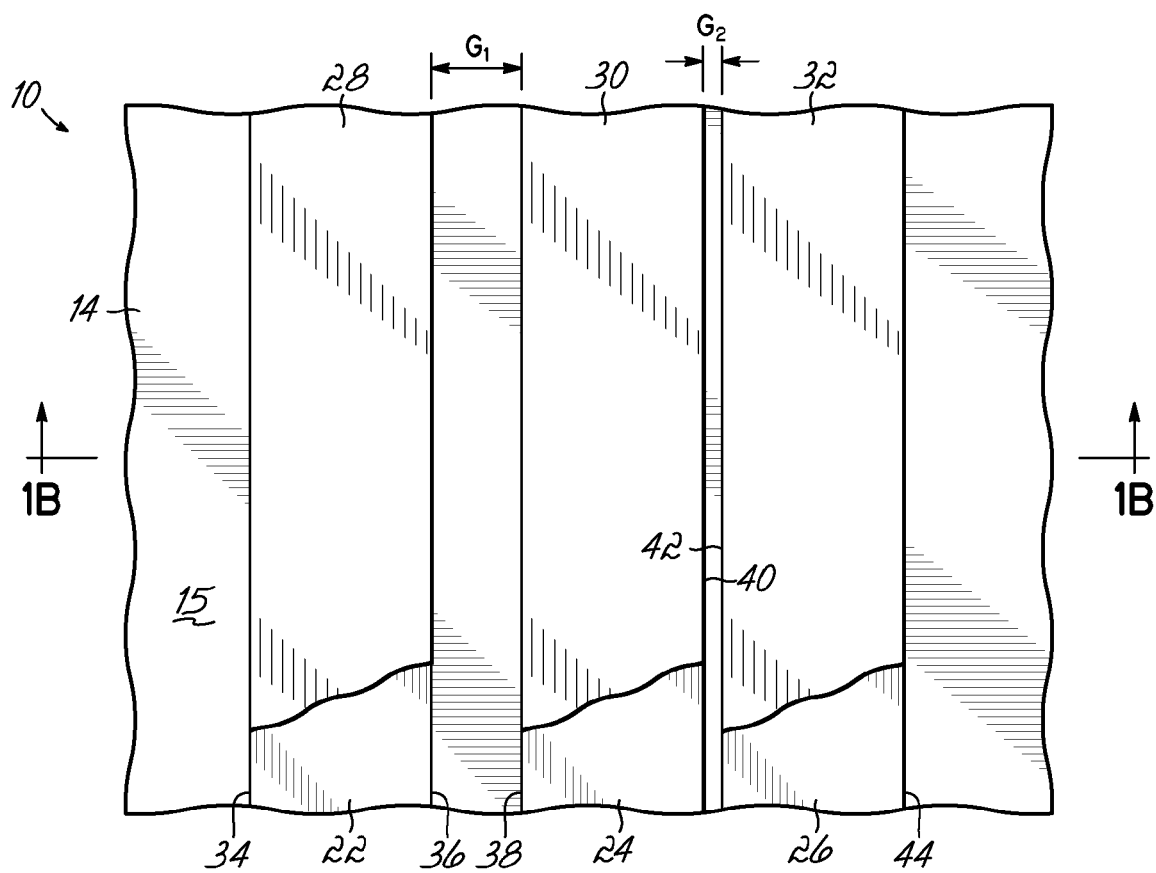
FIG. 1A is a diagrammatic top plan view of a device structure built on a portion of a semiconductor-on-insulator substrate at an initial fabrication stage of a processing method in accordance with an embodiment of the invention.
Figure 1B:
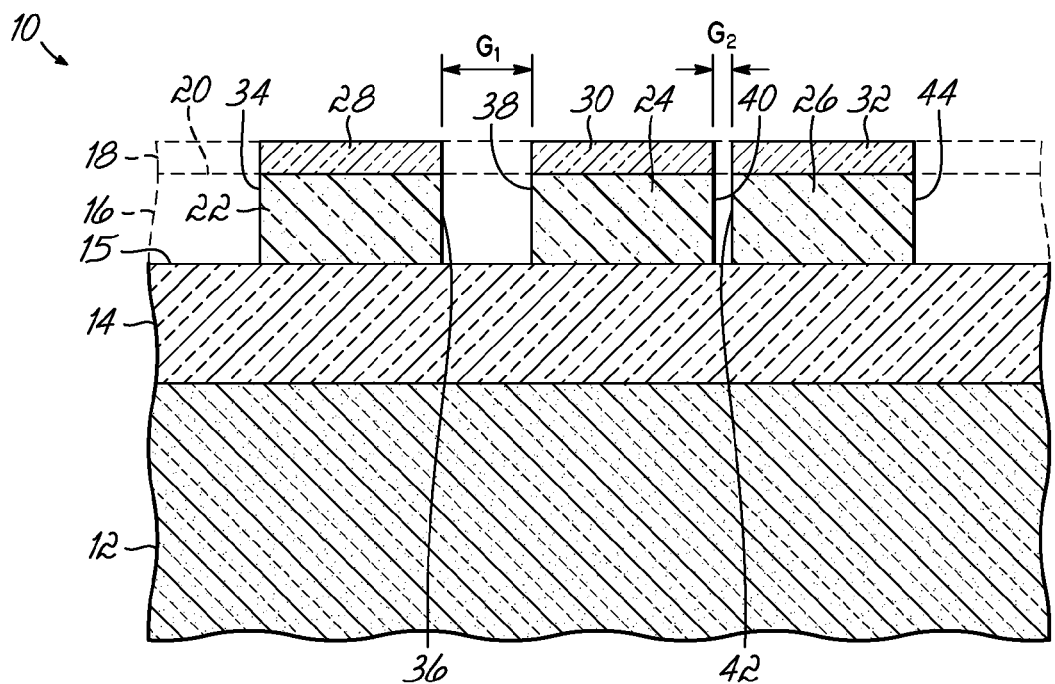
FIG. 1B is a diagrammatic cross-sectional view taken generally along line 1B-1B in FIG. 1A.

With reference to FIGS. 1A,B and in accordance with an embodiment of the invention, a semiconductor-on-insulator (SOI) substrate 10 includes a handle wafer 12, a buried insulating layer 14 formed of an insulating material such as silicon dioxide (e.g., $SiO_2$), and an active semiconductor or SOI layer 16 separated from the handle wafer 12 by the intervening buried insulating layer 14. The SOI layer 16 is constituted by a single crystal or monocrystalline semiconductor material, such as silicon or a material that primarily contains silicon. The handle wafer 12 may also be constituted by a single crystal or monocrystalline semiconductor material, such as silicon, or another type of material. The monocrystalline semiconductor material of the SOI layer 16 may contain a definite defect concentration and still be considered single crystal. The SOI layer 16, which is considerably thinner than the handle wafer 12 and is in direct contact with a top surface 15 of the buried insulating layer 14 to define an interface, is electrically isolated from the handle wafer 12 by the buried insulating layer 14. The SOI substrate 10 may be fabricated by any suitable conventional technique, such as a wafer bonding technique or a separation by implantation of oxygen (SIMOX) technique, which are techniques familiar to a person having ordinary skill in the art.

A pad layer 18 is disposed on a top surface 20 of the SOI layer 16 across the SOI substrate 10. The material forming pad layer 18 is selected to operate as a hardmask that etches selectively to the semiconductor material constituting the SOI layer 16. The hardness and wear resistance of the material constituting pad layer 18 are also adequate to function as a polish stop layer and reactive ion etch mask during subsequent fabrication stages. The pad layer 18 may be $SiO_2$ deposited by a thermal CVD process or $SiO_2$ grown by oxidizing a surface thickness of the SOI layer 16. Alternatively, the pad layer 18 may be composed of a different material, such as silicon-oxynitride ($SiO_xN_y$).

A plurality of juxtaposed bodies, of which three representative bodies 22, 24, 26 are visible in FIGS. 1A,B, are defined from the material of the SOI layer 16 by a conventional lithography and anisotropic etching process. The lithography process applies a resist (not shown) on pad layer 18, exposes the resist to a pattern of radiation, and develops the transferred pattern in the exposed resist. The pattern is transferred to the SOI layer 16 by a series of anisotropic dry etches, such as reactive-ion etching (RIE) or a plasma etching process, that patterns the pad layer 18 using the patterned resist as an etch mask and then patterns the SOI layer 16 using the patterned pad layer 18 as an etch mask. The etching process removes the material of the SOI layer 16 selective (i.e., at a significantly higher etch rate) to the material of the pad layer 18 and resist layer and stops on the buried insulating layer 14. After etching is concluded, residual resist is stripped by, for example, plasma ashing or chemical stripping.

The bodies 22, 24, 26 represent adjacent, parallel lines of the semiconductor material originating from the SOI layer 16 and are in direct contact with the top surface 15 of buried insulating layer 14. The gap, $G_1$, between the bodies 22, 24 and the gap, $G_2$, between the bodies 24, 26 are determined by the line width and pitch of the lithography process or by other sub-lithographic definition processes, such as pitch doubling sidewall image transfer. Residual dielectric caps 28, 30, 32, which represent residual portions of the material of pad layer 18 that remain intact after etching with the patterned resist in place, cover the respective bodies 22, 24, 26 in a stacked arrangement. Dielectric caps 28, 30, 32 have approximately the same footprint, in terms of width and length, as the bodies 22, 24, 26.

Sidewalls 34, 36 of body 22 extend from the top surface 20 toward the buried insulating layer 14 and intersect the buried insulating layer 14. Body 24 includes sidewalls 38, 40 that extend from top surface 20 toward the buried insulating layer 14 and intersect the buried insulating layer 14. Body 26 includes sidewalls 42, 44 that extend from top surface 20 toward the buried insulating layer 14 and intersect the buried insulating layer 14. Sidewall 36 of body 22 is contained in a plane that is aligned substantially parallel to, but spaced from, a plane containing sidewall 38 of body 24. Sidewalls 36, 38 are separated by the gap, $G_1$. Sidewall 40 of body 24 is contained in a plane that is aligned substantially parallel to, but spaced from, a plane containing sidewall 42 of body 26. Sidewalls 40, 42 are separated by the gap, $G_2$.

Figure 2A:
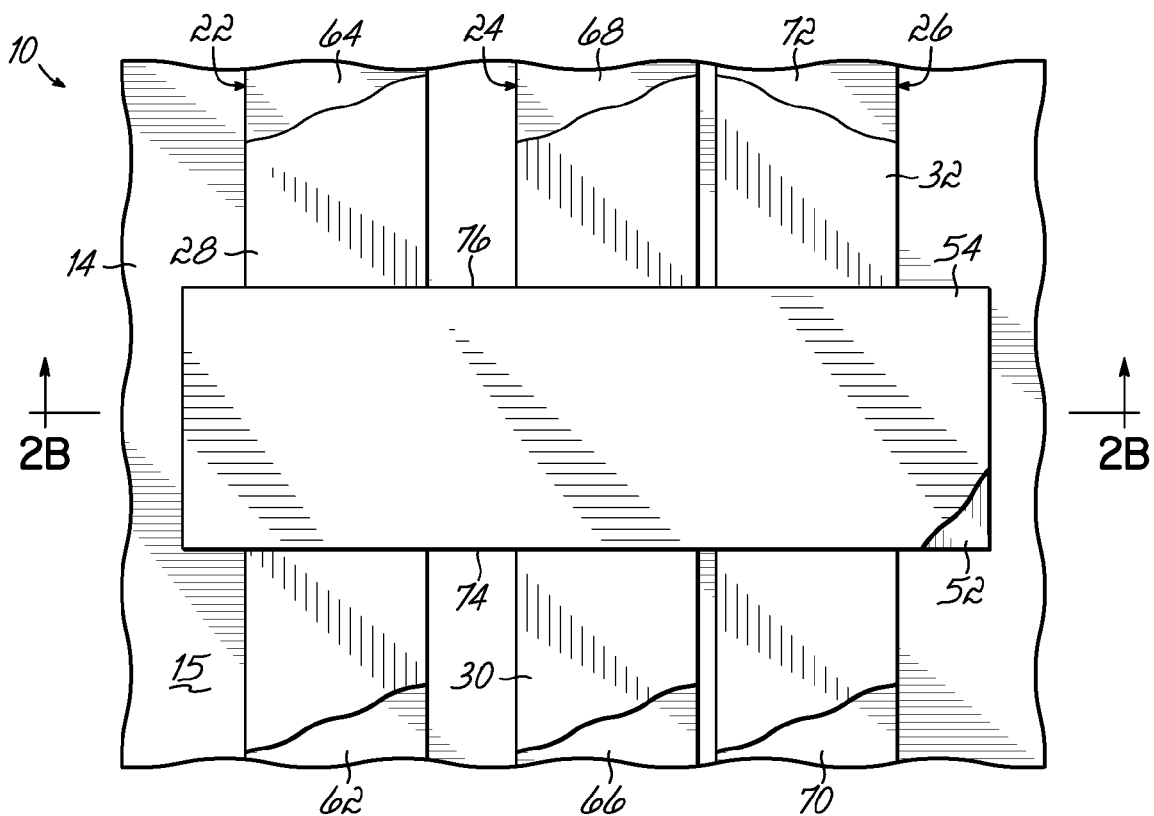
FIG. 2A is a diagrammatic top plan view of the device structure of FIG. 1A at a subsequent fabrication stage.
Figure 2B:
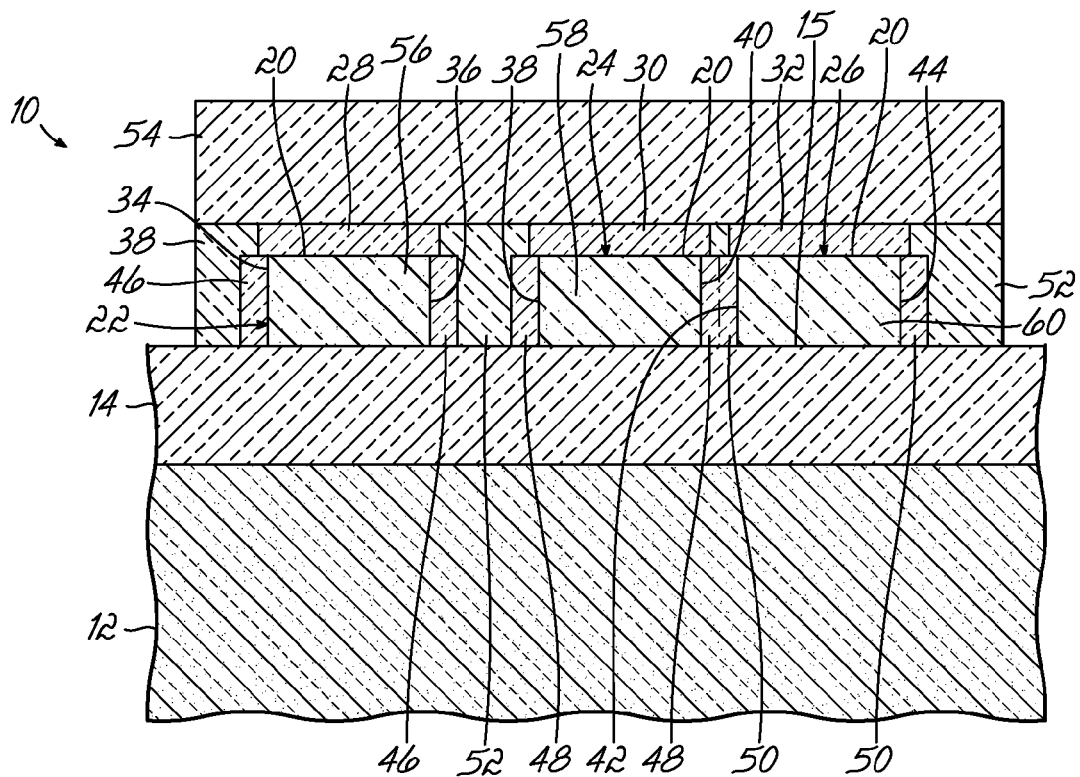
FIG. 2B is a diagrammatic cross-sectional view taken generally along line 2B-2B in FIG. 2A.

With reference to FIGS. 2A,B in which like reference numerals refer to like features in FIGS. 1A,B and at a subsequent fabrication stage, a dielectric layer 46 is then formed on opposite sidewalls 34, 36 of body 22, a dielectric layer 48 is formed on the opposite sidewalls 38, 40 of body 24, and a dielectric layer 50 is formed on the opposite sidewalls 42, 44 of body 26. In one embodiment, the dielectric material constituting dielectric layers 46, 48, 50 may be $SiO_2$ grown by a thermal oxidation process. The oxidation process entails exposing the bodies 22, 24, 26 to a dry or wet oxygen-laden, heated ambient in, for example, an oxidation furnace or a rapid thermal anneal chamber. Oxidation conditions are selected to provide an appropriate thickness for the dielectric layers 46, 48, 50, of which dielectric layers 46, 48 at least partially fill the gap, $G_1$, and dielectric layers 48, 50 at least partially fill the gap, $G_2$. In the representative embodiment, the dielectric layers 48, 50 completely fill the gap, $G_2$, between sidewalls 40, 42, and the dielectric layers 46, 48 only partially fill the gap, $G_1$, between sidewalls 36, 38, although the invention is not so limited.

A blanket layer 52 of a dielectric material is deposited to fill the open spaces about the bodies 22, 24, 26. In particular, a portion of the dielectric layer 52 fills the remainder of the narrowed gap, $G_1$, between the sidewalls 36, 38 that is unfilled by dielectric layers 46, 48. Another portion of the dielectric layer 52 fills the remainder of the narrowed gap, $G_2$, between the sidewalls 40, 42 if not completely filled by dielectric layers 46, 48. The dielectric layer 52 may be composed of stoichiometric or non-stoichiometric $SiO_2$ deposited by a chemical vapor deposition (CVD) process, or other dielectrics, including silicon oxy-nitride, hafnium oxide, or any other material with predominately dielectric properties. The dielectric layer 52 is planarized by a conventional planarization process, such as a chemical mechanical polishing (CMP) process, that removes the excess overburden of the blanket dielectric layer 52 and stops on the dielectric caps 28, 30, 32. Typically if the dielectric material is $SiO_2$, the quality of $SiO_2$ in the dielectric layers 46, 48, 50 is superior to the quality of the $SiO_2$ in dielectric layer 52 because of the different formation processes.

A person having ordinary skill in the art will appreciate that the portion of the dielectric layer 52 in the gap, $G_1$, between the sidewalls 36, 38 is optional and that the dielectric layers

46, 48 may have a thickness sufficient to completely fill and close the gap, $G_1$, between the sidewalls 36, 38.

A photoresist mask 54 is then formed from a resist layer that is patterned by a conventional lithography and anisotropic etching process. Opposite side edges of the photoresist mask 54 have a roughly orthogonal alignment relative to the bodies 22, 24, 26. An anisotropic etching process is applied to remove the material of the dielectric layers 46, 48, 50, 52 selective to the semiconductor material of the bodies 22, 24, 26. Dielectric material in the dielectric caps 28, 30, 32 and portions of the dielectric layers 46, 48, 50, 52 located beneath the photoresist mask 54 are preserved during the etching process because of the masking. The etching process operates to remove the dielectric caps 28, 30, 32 and dielectric layers 46, 48, 50, 52 outside of the protective footprint of the photoresist mask 54 so that the unmasked semiconductor material of the bodies 22, 24, 26 is exposed.

Figure 4A:
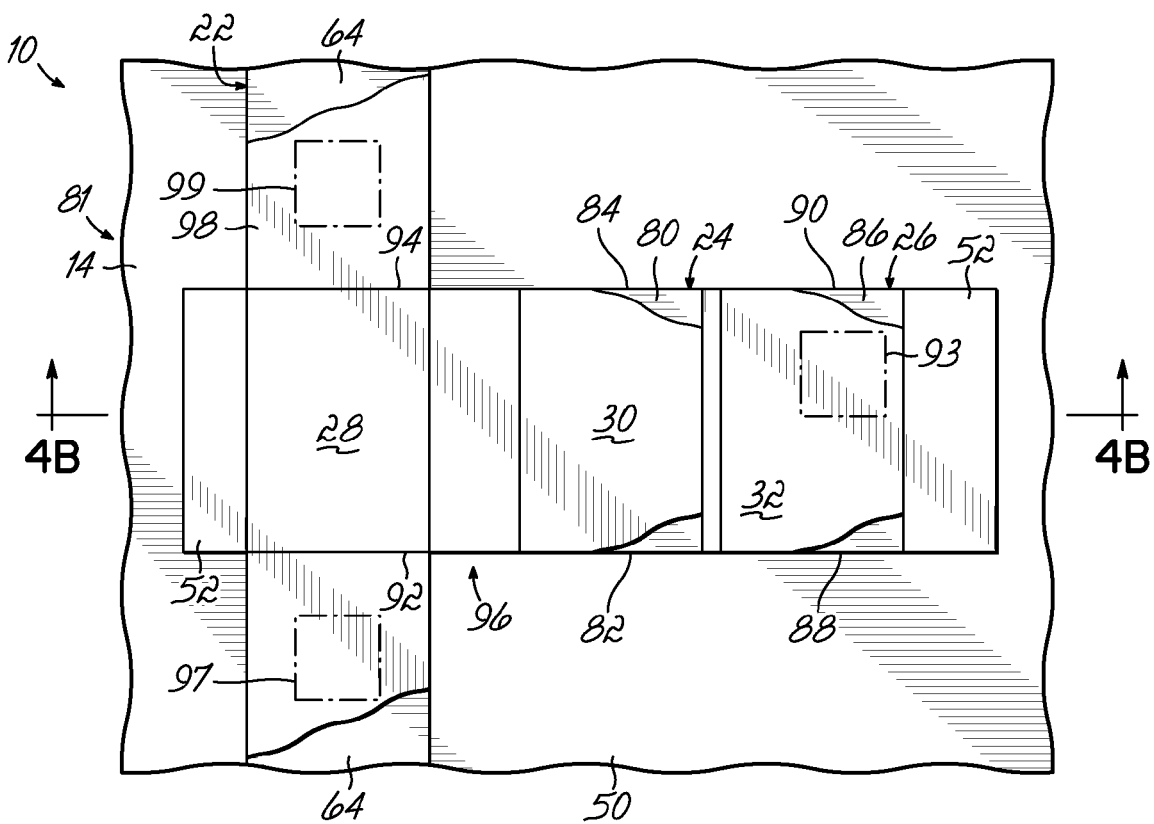
FIG. 4A is a diagrammatic top plan view of the device structure of FIG. 3A at a subsequent fabrication stage.
Figure 4B:
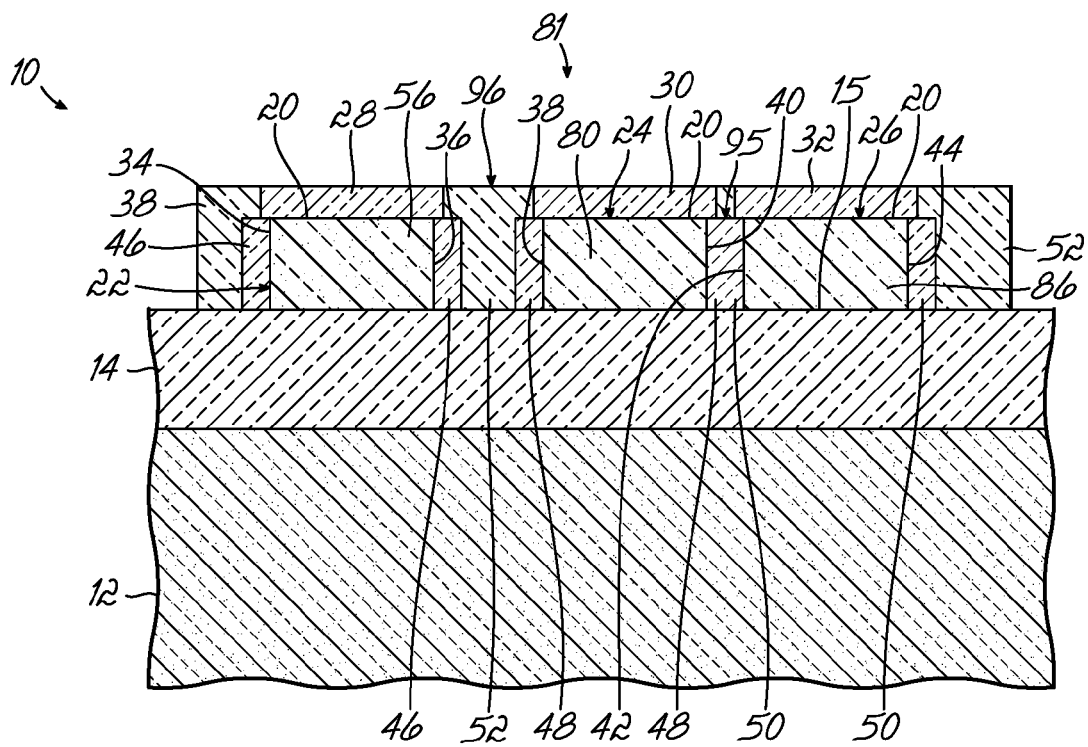
FIG. 4B is a diagrammatic cross-sectional view taken generally along line 4B-4B in FIG. 4A.

After etching, the photoresist mask 54 intersects body 22 along a central channel 56, covers a portion 58 of body 24, and covers a portion 60 of body 26. Opposite end regions 62, 64 of body 22, which flank the channel 56, opposite end regions 66, 68 of body 24, and opposite end regions 70, 72 of body 26 project or protrude outwardly from opposite sidewalls 74, 76 of the photoresist mask 54. The end regions 62, 64 of body 22 are implanted with a suitable n-type or p-type dopant at a dose effective to define a source and a drain, respectively, for the device structure 81 (FIGS. 4A,B). The photoresist mask 54 blocks the dopant from entering the channel 56 of body 22, the covered portion 58 of body 24, and the covered portion 60 of body 26. End regions 66, 68 of body 24, and end regions 70, 72 of body 26, which are unmasked and receive dopant, are excised in a subsequent fabrication stage. Shallow source/drain extensions and halos (not shown) may be introduced into body 22 beneath the opposing sidewalls 74, 76 of the photoresist mask 54 by angled ion implantations.

Figure 3A:
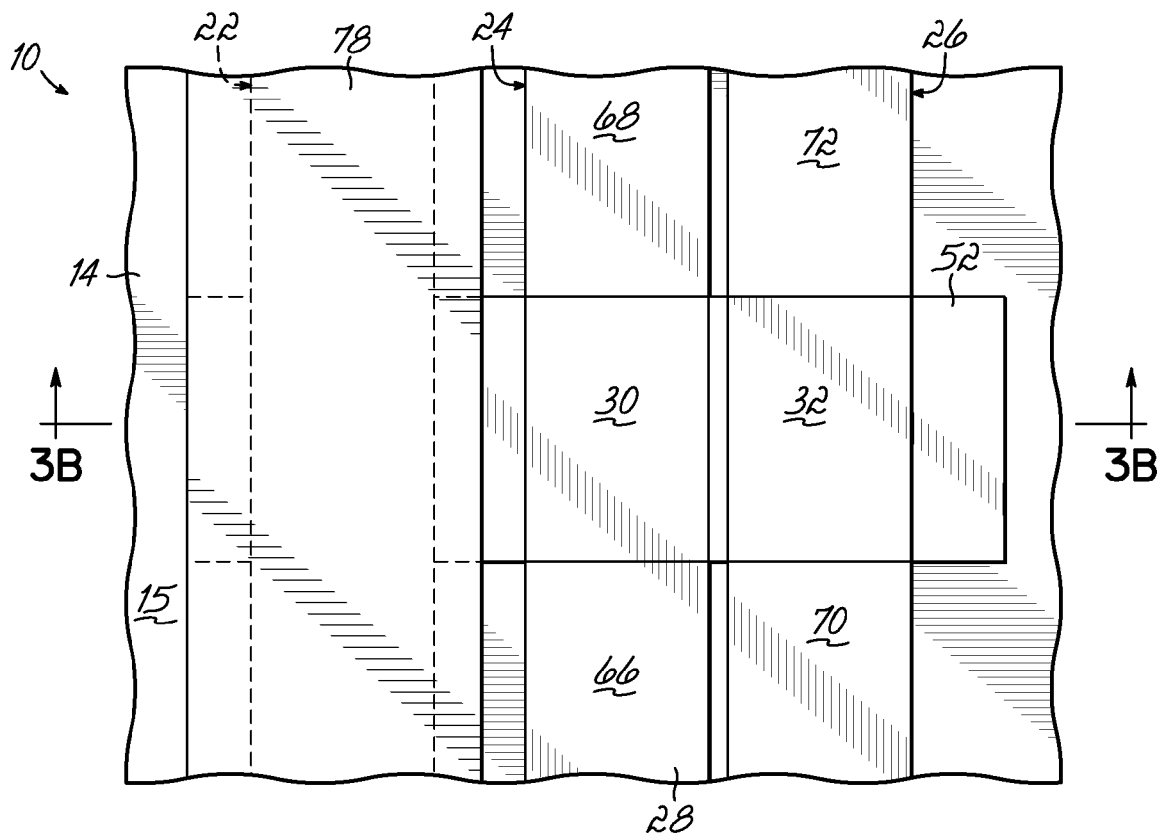
FIG. 3A is a diagrammatic top plan view of the device structure of FIG. 2A at a subsequent fabrication stage.

With reference to FIGS. 3A,B in which like reference numerals refer to like features in FIGS. 2A,B and at a subsequent fabrication stage, the photoresist mask 54 (FIGS. 2A,B) is removed by, for example, plasma ashing or chemical stripping. Another photoresist mask 78 is then formed from a resist layer that is patterned by a conventional lithography and anisotropic etching process. The photoresist mask 78 has a parallel alignment with body 22 and extends laterally beyond the opposite sidewalls 34, 36 of body 22. The dielectric cap 30 and dielectric layers 48, 52 operate as a hard mask for the covered portion 58 of body 24. The dielectric cap 32 and dielectric layers 50, 52 operate as a hard mask for the covered portion 60 of body 26.

Figure 3B:
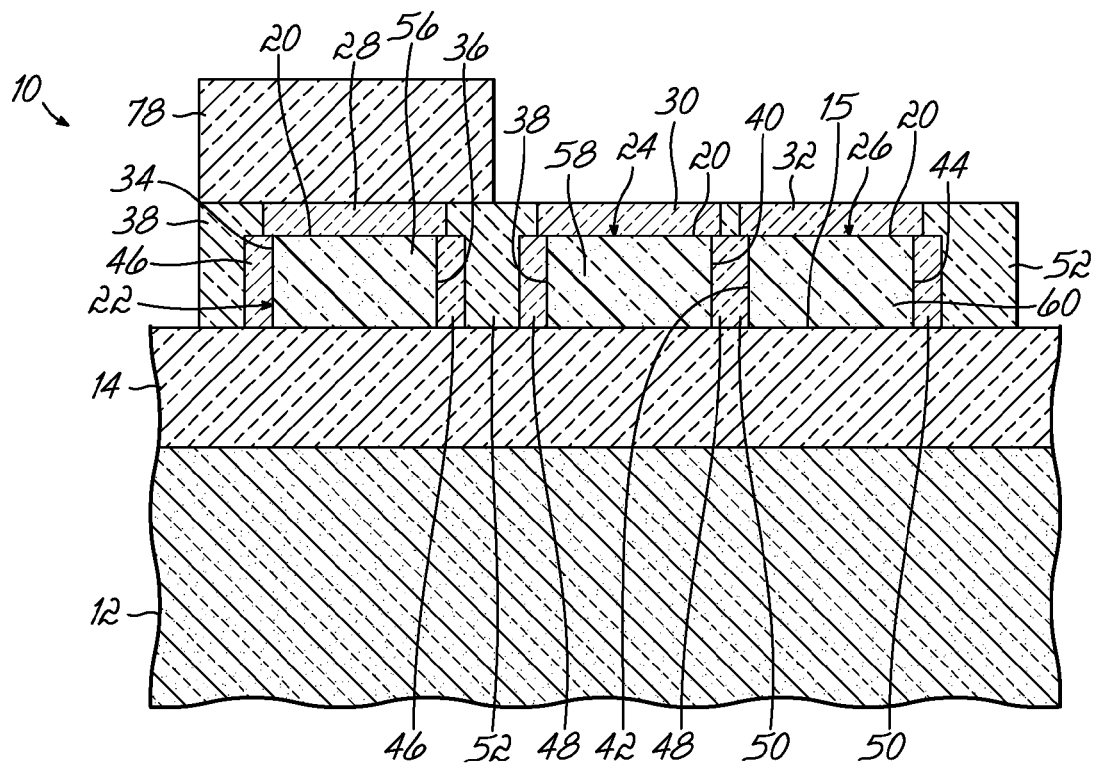
FIG. 3B is a diagrammatic cross-sectional view taken generally along line 3B-3B in FIG. 3A.

With reference to FIGS. 4A,B in which like reference numerals refer to like features in FIGS. 3A,B and at a subsequent fabrication stage, the unprotected semiconductor material in the end regions 66, 68 of the body 24 and the end regions 70, 72 of the body 26 is removed by an anisotropic etching process selective to the dielectric materials constituting dielectric caps 30, 32 and dielectric layers 48, 50, 52. The covered portion 58 (FIG. 3B) of the semiconductor material of body 24 is preserved and serves as a floating gate electrode 80 for a device structure, which is generally indicated by reference numeral 81. The etching process, which stops on the buried insulating layer 14, truncates the body 24 so that floating gate electrode 80 has opposite end walls 82, 84 that extend to the buried insulating layer 14. The covered portion 60 (FIG. 3B) of the semiconductor material of body 26 is preserved and serves as a control gate electrode 86 for device structure 81. The etching process, which stops on the buried insulating layer 14, truncates the body 26 so that control gate electrode 86 has opposite end walls 88, 90 that extend to the buried insulating layer 14. The photoresist mask 78, which protects the opposite end regions 62, 64 of body 22 during the etching process, is removed by, for example, plasma ashing or chemical stripping.

The hard mask supplied by the dielectric cap 30 and the presence of the dielectric layers 48, 52, as well as the presence of the photoresist mask 78, operates to self-align the floating gate electrode 80 with the channel 56 of body 22, as well as to self-align the floating gate electrode 80 with the source and drain in the doped opposite end regions 62, 64 of body 24. Specifically, end wall 82 of the floating gate electrode 80 is generally aligned (i.e., coplanar) with the planar interfaces between the channel 56 in body 22 and the doped region in the end region 62 of body 22 representing the source for the device structure 81. Similarly, end wall 84 of the floating gate electrode 80 is generally aligned (i.e., coplanar) with the planar interfaces between the channel 56 in body 22 and the doped region in the end region 64 of body 22 representing the drain for the device structure 81. These planar interfaces generally underlie the opposite side edges 92, 94 of the dielectric cap 28 and extend through the body 22 from these positions underlying the side edges 92, 94 to the buried insulating layer 14.

The hard mask supplied by the dielectric cap 32 and the presence of the dielectric layers 50, 52 operates to self-align the control gate electrode 86 with floating gate electrode 80. Specifically, end wall 88 of the control gate electrode 86 is generally aligned (i.e., coplanar) with end wall 82 of the floating gate electrode 80. Similarly, end wall 90 of the control gate electrode 86 is generally aligned (i.e., coplanar) with end wall 84 of the floating gate electrode 80.

After etching, the floating gate electrode 80 represents the residual portion of the monocrystalline semiconductor material of body 24 and the control gate electrode 86 represents the residual portion of the monocrystalline semiconductor material of body 26. The floating gate electrode 80 is physically separated from the channel 56 of body 22 by the thickness of the dielectric layer 46 on sidewall 36 of body 22, the thickness of the dielectric layer 48 on sidewall 38 of body 24, and the thickness of the dielectric layer 52 between dielectric layers 46, 48, which collectively define a tunnel dielectric layer generally indicated by reference numeral 96. The tunnel dielectric layer 96 physically separates the floating gate electrode 80 from the channel 56 of body 22 and electrically isolates the floating gate electrode 80 from the channel 56. The thickness of the tunnel dielectric layer 96, which is primarily determined when the SOI layer 16 is lithographically patterned, is selected to prevent excess charge leakage from the floating gate electrode 80 that, if not prevented, would reduce data retention time.

The control gate electrode 86 is physically separated from the floating gate electrode 80 by the thickness of the dielectric layer 48 on sidewall 40 of body 24, the thickness of the dielectric layer 50 on sidewall 42 of body 26, and optionally any portion of dielectric layer 52 between dielectric layers 48, 50, which collectively define an intergate dielectric layer generally indicated by reference numeral 95. The intergate dielectric layer 95 physically separates the control gate electrode 86 from the floating gate electrode 80 and, because of the constituent dielectric material, also electrically isolates the control gate electrode 86 from the floating gate electrode 80. The intergate dielectric layer 95 is thinner than the tunnel dielectric layer 96 to promote the operability of the device structure 81 as a memory cell in a NVRAM.

The floating gate electrode 80, the control gate electrode 86, and the body 22 containing channel 56 have nominally equal thicknesses measured from their respective top surfaces to the buried insulating layer 14 and are composed of substantially identical portions of monocrystalline silicon that originated from the SOI layer 16.

A silicide layer 98 is formed on the exposed end regions 62, 64 of body 22 that are not covered by dielectric cap 28 and dielectric layers 46, 52 and, in particular, on the top surfaces of end regions 62, 64. Silicidation processes are familiar to a person having ordinary skill in the art. In an exemplary silicidation process, the silicide layer 98 may be formed by depositing a layer of suitable metal, such as nickel, cobalt, tungsten, titanium, etc., and then annealing with, for example, a rapid thermal annealing process, to react the metal with the silicon-containing semiconductor material (e.g., silicon) of the end regions 62, 64 of body 22. The silicidation process may be conducted in an inert gas atmosphere or in a nitrogen-rich gas atmosphere, and at a temperature of about 350° C. to about 600° C. contingent upon the type of silicide being considered for silicide layer 98. Following the high temperature anneal, unreacted metal remains on areas of the device structure 81 where the deposited metal is not in contact with a silicon-containing material. The unreacted metal is selectively removed with an isotropic wet chemical etch process. The process self aligns the silicide to the exposed silicon-containing regions because of the selective reaction between the metal and silicon-containing semiconductor material.

The device structure 81 includes the source and drain defined in the end regions 62, 64 of body 22 and channel 56 between end regions 62, 64, the floating gate electrode 80 defined from the adjacent body 24 of single crystal semiconductor, and the control gate electrode 86 formed from the adjacent body 26 of single crystal semiconductor, as well as the tunnel dielectric layer 96 and the intergate dielectric layer 95. The body thickness of the body 22, the thickness of the intergate dielectric layer 95, and the thickness of the tunnel dielectric layer 96 can be independently adjusted during fabrication.

During the fabrication process, the device structure 81 is replicated across at least a portion of the surface area of the SOI layer 16 of the SOI substrate 10. Standard processing follows, which includes formation of metallic contacts, metallization for the M1 level interconnect wiring, and interlayer dielectric layers, conductive vias, and metallization for upper level (M2-level, M3-level, etc.) interconnect wiring. Metallization in the contact level of the interconnect wiring establishes an electrical contact 93 with the control gate electrode 86 and independent electrical contacts 97, 99 mediated by the silicide layer 98 with the source and drain defined in the end regions 62, 64 of body 22. The floating gate electrode 80 remains uncontacted. Other types of device structures may be fabricated on other surface areas of the SOI substrate 10 and entirely independent of the fabrication process forming device structures like device structure 81, or some of the process steps may be shared with steps used to form the conventional devices.

Figure 5:
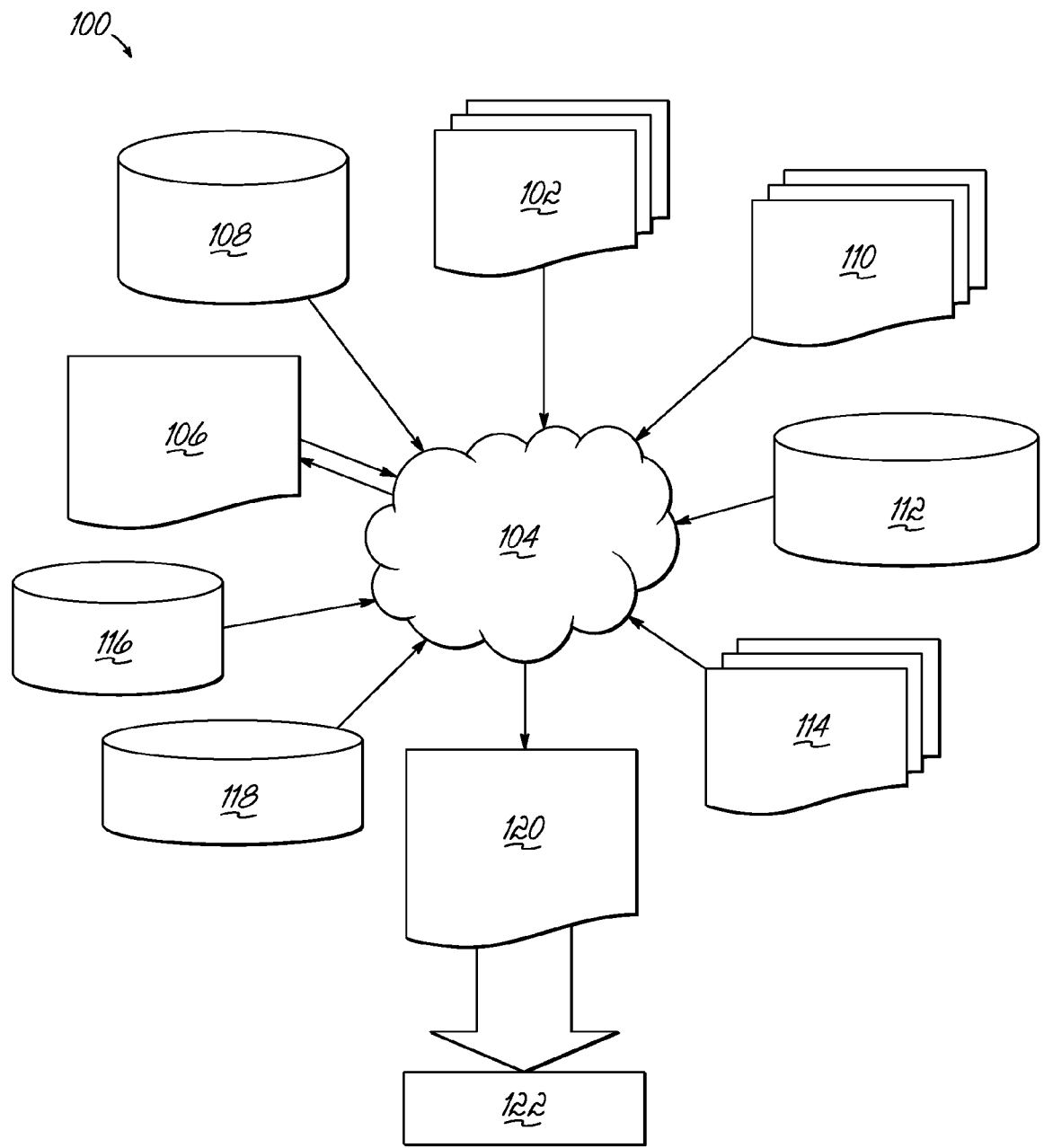
FIG. 5 is a flow diagram of a design process used in semiconductor design, manufacture, and/or test.

FIG. 5 shows a block diagram of an exemplary design flow 100 used for example, in semiconductor design, manufacturing, and/or test. Design flow 100 may vary depending on the type of integrated circuit (IC) being designed. For example, a design flow 100 for building an application specific IC (ASIC) may differ from a design flow 100 for designing a standard component. Design structure 102 is preferably an input to a design process 104 and may come from an IP provider, a core developer, or other design company or may be generated by the operator of the design flow, or from other sources. Design structure 102 comprises an embodiment of the invention as shown in FIGS. 4A,B in the form of schematics or HDL, a hardware-description language (e.g., Verilog, VHDL, C, etc.). Design structure 102 may be contained on one or more machine readable medium. For example, design structure 102 may be a text file or a graphical representation of an embodiment of the invention as shown in FIGS. 4A,B. Design process 104 preferably synthesizes (or translates) an embodiment of the invention as shown in FIGS. 4A,B into a netlist 106, where netlist 106 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 106 is resynthesized one or more times depending on design specifications and parameters for the circuit.

Design process 104 may include using a variety of inputs; for example, inputs from library elements 108 which may house a set of commonly used elements, circuits, and devices, including models, layouts, and symbolic representations, for a given manufacturing technology (e.g., different technology nodes, 32 nm, 45 nm, 90 nm, etc.), design specifications 110, characterization data 112, verification data 114, design rules 116, and test data files 118 (which may include test patterns and other testing information). Design process 104 may further include, for example, standard circuit design processes such as timing analysis, verification, design rule checking, place and route operations, etc. One of ordinary skill in the art of integrated circuit design can appreciate the extent of possible electronic design automation tools and applications used in design process 104 without deviating from the scope and spirit of the invention. The design structure of the invention is not limited to any specific design flow.

Design process 104 preferably translates an embodiment of the invention as shown in FIGS. 4A,B, along with any additional integrated circuit design or data (if applicable), into a second design structure 120. Design structure 120 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 120 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 4A,B. Design structure 120 may then proceed to a stage 122 where, for example, design structure 120 proceeds to tape-out, is released to manufacturing, is released to a mask house, is sent to another design house, is sent back to the customer, etc.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "includes", "having", "has", "with", or variants thereof are used in either the detailed description or the claims, such terms are intended to be inclusive in a manner similar to the term "comprising."

The fabrication of the semiconductor structure herein has been described by a specific order of fabrication stages and steps. However, it is understood that the order may differ from that described. For example, the order of two or more fabrication steps may be swapped relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of fabricating a device structure for a non-volatile random access memory from a semiconductor layer carried on an insulating layer, the method comprising:
    forming first, second, and third semiconductor bodies from the semiconductor layer and with a juxtaposed relationship in which the second semiconductor body is disposed between the first and third semiconductor bodies;
    doping the first semiconductor body to form a source and a drain;
    forming a first dielectric layer between the first semiconductor body and the second semiconductor body;
    forming a second dielectric layer between the second semiconductor body and the third semiconductor body;
    after the first and second dielectric layers are formed, masking a first portion of the second semiconductor body and a first portion of the third semiconductor body; and
    after the first portion of the second semiconductor body and the first portion of the third semiconductor body are masked, concurrently removing a second portion of the second semiconductor body and a second portion of the third semiconductor body with a selective etching process,
    wherein the second semiconductor body and the third semiconductor body respectively define a floating gate electrode and a control gate electrode that cooperate to control carrier flow in a channel in the first semiconductor body between the source and the drain.

2. The method of claim 1 wherein the first semiconductor body includes a first sidewall and the second semiconductor body includes a second sidewall that confronts the first sidewall, and forming the first dielectric layer further comprises:
    concurrently growing a first silicon dioxide layer on the first sidewall of the first semiconductor body and a second silicon dioxide on the second sidewall of the second semiconductor body with a thermal oxidation process.

3. The method of claim 2 wherein the first and second silicon dioxide layers are separated by a gap, and forming the first dielectric layer further comprises:
    depositing a fill layer of a dielectric material to fill between the first and second silicon dioxide layers.

4. The method of claim 1 wherein the second semiconductor body includes a sidewall and the third semiconductor body includes a sidewall that confronts the sidewall of the second semiconductor body, and forming the second dielectric layer further comprises:
    growing a first silicon dioxide layer on the sidewall of the second semiconductor body and a second silicon dioxide on the sidewall of the third semiconductor body with a thermal oxidation process.

5. The method of claim 4 wherein the first and second silicon dioxide layers are separated by a gap, and forming the first dielectric layer further comprises:
    depositing a fill layer of a dielectric material to fill the gap between the first and second silicon dioxide layers; and
    polishing the fill layer to planarize the dielectric material.

6. The method of claim 5 wherein the dielectric material of the fill layer is silicon dioxide.

7. The method of claim 4 wherein the first silicon dioxide layer and the second silicon dioxide layer are concurrently grown with the thermal oxidation process.

8. The method of claim 1 wherein the semiconductor layer is monocrystalline silicon, the first semiconductor body is formed concurrently with the second and third semiconductor bodies, and forming the first, second and third semiconductor bodies further comprises:
    forming a hard mask on the monocrystalline silicon of the semiconductor layer;
    patterning the hard mask with masked regions that are complimentary to the first, second, and third semiconductor bodies; and
    concurrently removing unmasked portions of the layer of the monocrystalline silicon to form the first, second, and third semiconductor bodies.

9. The method of claim 1 wherein partially removing the second semiconductor body and the third semiconductor body further comprises:
    partially masking the second and third semiconductor bodies with respective dielectric caps; and
    concurrently removing unmasked portions of the second and third semiconductor bodies with an etching process that removes the unmasked portions selective to the dielectric caps to respectively define the control and floating gate electrodes.

10. The method of claim 9 further comprising:
    forming a photoresist mask on the first semiconductor body to protect the first semiconductor body against the etching process when the unmasked portions of the second and third semiconductor bodies are removed.

11. The method of claim 1 wherein the control gate electrode has a sidewall, and the floating gate electrode has a sidewall that is aligned with the sidewall of the control gate electrode.

12. The method of claim 1 wherein the first dielectric layer is formed between the first semiconductor body and the second semiconductor body after the first and second semiconductor bodies are formed.

13. The method of claim 1 wherein the second dielectric layer is formed between the second semiconductor body and the third semiconductor body after the second and third semiconductor bodies are formed.

14. The method of claim 1 wherein the first dielectric layer is formed between the first semiconductor body and the second semiconductor body and the second dielectric layer is formed between the second semiconductor body and the third semiconductor body after the first, second, and third semiconductor bodies are formed.

15. The method of claim 1 wherein the partial removal of the second semiconductor body is concurrent with the partial removal of the third semiconductor body.

16. The method of claim 1 wherein the first, second, and third semiconductor bodies are concurrently formed from the semiconductor layer.

* * * * *